United States Patent
Suda

(10) Patent No.: US 6,530,053 B1
(45) Date of Patent: Mar. 4, 2003

(54) SEMICONDUCTOR DEVICE

(75) Inventor: Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/516,178

(22) Filed: Mar. 1, 2000

(30) Foreign Application Priority Data

Mar. 1, 1999 (JP) ............................................ 11-052111
Jan. 27, 2000 (JP) ...................................... 2000-019390

(51) Int. Cl.[7] ................................................ G06F 11/00
(52) U.S. Cl. ........................................................ 714/738
(58) Field of Search ................................. 714/738, 724; 324/76.11

(56) References Cited

U.S. PATENT DOCUMENTS 4,300,234 A * 11/1981 Maruyama et al.
6,356,514 B1 * 3/2002 Wells et al.

* cited by examiner

Primary Examiner—Phung M. Chung
(74) Attorney, Agent, or Firm—Rosenthal & Osha L.L.P.

(57) ABSTRACT

A semiconductor device capable of improving a yield rate in a semiconductor testing process. The semiconductor device includes a measuring object circuit, a pattern generation circuit for generating a test pattern used for testing the operation of the measuring object circuit, a data output terminal for outputting a test result generated by the measuring object circuit when the test pattern is given to the measuring object circuit, a register for storing the test result when the test is performed, an oscillator for generating and giving a clock with a frequency used for the test to the measuring object circuit, a controller for controlling a test interval signal indicating a test interval for the test to be active for a predetermined cycle by synchronizing with the oscillator after receiving the activation signal, a delay circuit for delaying the clock for a predetermined time, and a ripple counter for dividing the clock delayed by the delayed circuit.

32 Claims, 6 Drawing Sheets

SEMICONDUCTOR DEVICE

This patent application claims priority based on a Japanese patent applications, H11-052111 filed on Mar. 1 and 2000-19390 filed on Jan. 27, 2000, the contents of which are incorporated herein by reference.

BACKGROUND OF THE INVENTION

1. Field of the Invention

The present invention relates to a semiconductor device. More particularly, the present invention relates to a semiconductor device used for testing a circuit installed within a circuit.

2. Description of the Related Art

In accordance with the conventional method, a test pattern signal is input through a probe needle of a prober by contacting the probe needle with a tested semiconductor in a pre-process test. This enables testing of whether or not a semiconductor such as a gate array or a system integrated circuit functions correctly, before the semiconductor is packaged.

However, it is difficult to test a semiconductor in advance, for a frequency range used in practice, since impedance of the probe needle is unequal to impedance of the tested semiconductor, and impedance of the probe needle is large. Thus, in the conventional pre-process test, the semiconductor is only tested using a lower frequency than those frequencies used in practice. Because of this, a semiconductor, which fails in the test with a frequency used in practice, has been processed in an up-coming process which thus causes reduction of yield rate in the latter process. Thus, the object of the present invention is to provide a semiconductor device capable of resolving the above-described problems. This object is achieved by combining characteristics recited in independent claims within the patent claims. In addition, dependent claims define further advantageous embodiments of the present invention.

SUMMARY OF THE INVENTION

It is preferable that a semiconductor device of the first preferred embodiment of the present invention include a measuring object circuit, a pattern generation circuit for generating a test pattern used for testing the operation of a measuring object circuit, and a data output terminal for outputting a test result generated by said measuring object circuit when a test pattern is given to the said measuring object circuit. Further, it is preferable that the semiconductor device includes a register for storing the test result when the test is performed. The data output terminal outputs the test result which is temporarily stored in the register. It is also preferable that the register includes plural flip-flops connected in series for storing the test result input from said measuring object circuit.

In addition, it is preferable that the semiconductor device includes a selector for selecting and outputting one of the test results stored in each of plural registers. In this case, the data output terminal outputs the test result selected by the selector to the exterior of the semiconductor device. Further, the semiconductor device may include an oscillator for generating and providing to the measuring object circuit a clock with a frequency used for the test, and a frequency control unit for controlling the frequency of oscillation of said oscillator. The frequency control unit may include an oscillation controller for outputting a signal to said oscillator, instructing the required frequency of oscillation.

The oscillator may generate a clock with a maximum frequency under which the semiconductor device may operate normally. It is preferable that the oscillator includes an inverter for outputting a reversed input signal, a multiple stage delay device for delaying a signal output by said inverter, and a delay selector for selecting any output from said delay device for input to the inverter.

Furthermore, it is preferable that the semiconductor includes a trigger input terminal for inputting an activation signal to start the test, and a controller for controlling a test interval signal indicating an interval for the active period of test for a predetermined cycle. This control is achieved by synchronizing with said oscillator when the activation signal is received, whereby the pattern generation circuit generates the test pattern when the test interval signal is active. Still further, it is preferable that the semiconductor includes a delay circuit for delaying the clock for a predetermined time, and a register for storing the test result based on the clock delayed by said delay circuit. It is preferable that the semiconductor device further includes a ripple counter for dividing the clock delayed by said delayed circuit and a clock output terminal for outputting the divided clock. It is preferable that the ripple counter includes plural flip-flops connected in series for dividing an output signal output from the delay circuit. The delay circuit may include plural flip-flops connected in series for memorizing the test interval signal output from the controller.

In addition, it is preferable that the semiconductor device includes a counter for counting a clock number of a signal of the clock input after receiving a test start signal. Said controller inactivates the test interval signal when a count value of said counter reaches a predetermined value. It is preferable that the pattern generation circuit includes a memory for inputting a count value output from said counter and outputting a predetermined test pattern to said measuring object circuit corresponding to the count value. It is preferable that the controller includes a delay flip-flop for outputting the activation signal when the activation signal becomes active, and a flip-flop for initiating output of said test interval signal when the delay flip-flop outputs the activation signal and inactivating the test interval signal when the count value of the counter reaches a predetermined value.

It is preferable that the data output terminal has a data output terminal for outputting from the measuring object circuit the test result generated by the measuring object circuit, to the outside of the semiconductor device. The semiconductor device may include a clock input terminal for inputting a clock used in the test and supply to said measuring object circuit. The semiconductor device may include a clock selector for selecting one of clocks oscillated by said oscillator, in order to oscillate the clock used for the test, and supply to said measuring object circuit.

In addition, the semiconductor device may include a data input terminal for inputting the test pattern and supply to the measuring object circuit. This data input terminal is used in practice as the data input terminal for the measuring object circuit. It is preferable that the pattern generation circuit includes a data selector to select one test pattern from the test patterns output by a memory memorizing the test patterns and the test patterns input from the data terminal, for output to said measuring object circuit.

The summary of the invention described above does not list all characteristics necessary to the present invention. Sub-combinations of these characteristics may also include the present invention.

BRIEF DESCRIPTION OF THE DRAWINGS

The present invention will be understood more fully from the detailed description provided below, in conjunction with the accompanying drawings.

DETAILED DESCRIPTION OF THE INVENTION

The invention will now be described based on the preferred embodiments. This does not intend to limit the scope of the present invention, but exemplify the invention. All of the features and the combinations thereof described in the embodiments are not necessarily essential to the invention.

Figure 1:
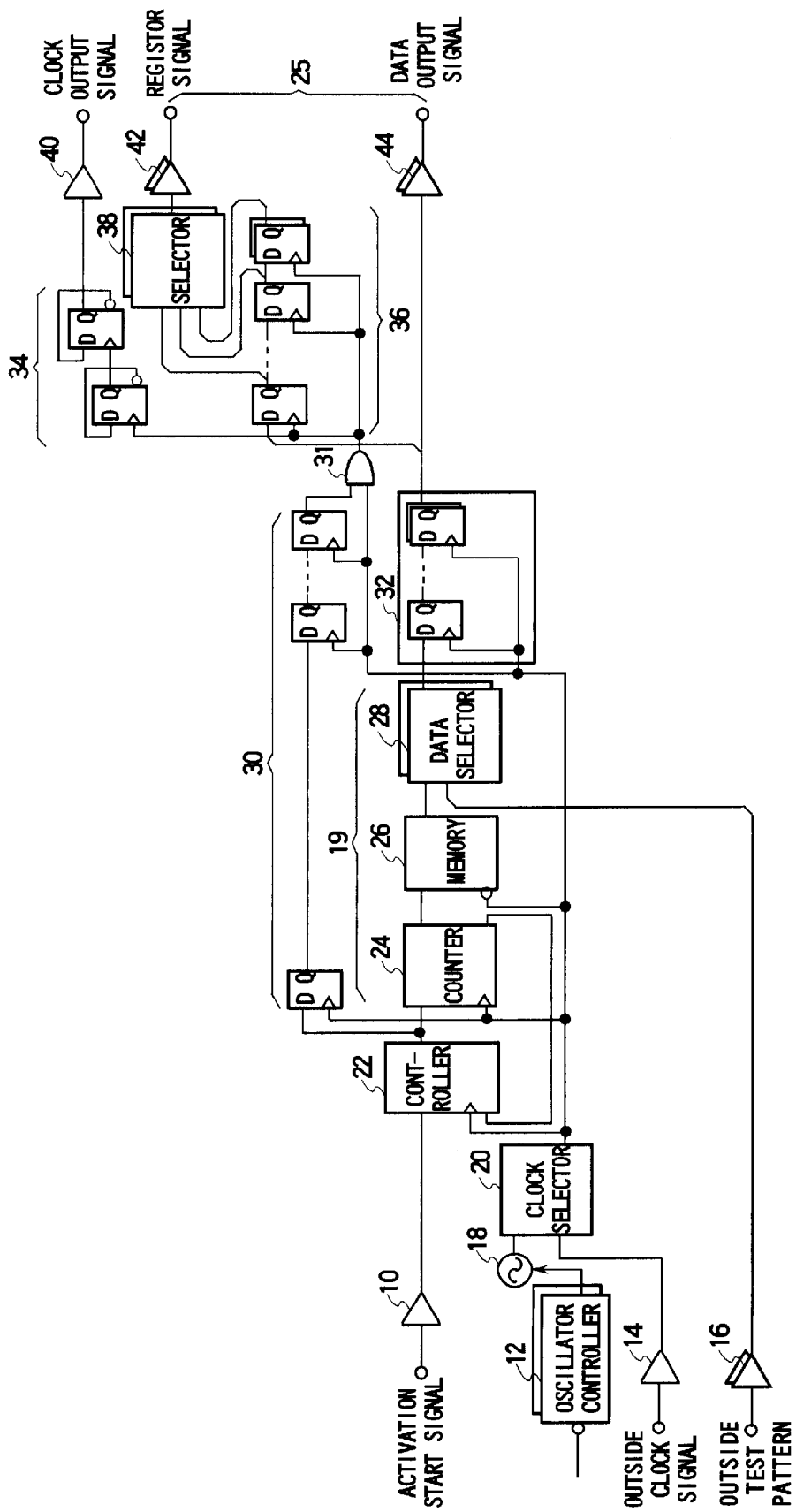
FIG. 1 shows a circuit diagram of the semiconductor device 52 of the present invention.

FIG. 1 shows a circuit diagram of a semiconductor device 52 of the present invention. The semiconductor device 52 includes a measuring object circuit 32, a pattern generation circuit 19 for generating a testing pattern used for testing performance of the measuring object 32, a data output terminal 25 for outputting the test result generated by the measuring object 32, a controller 22 for outputting a test interval signal to the pattern generation circuit 19 for a predetermined cycle, an oscillator 18 for generating a frequency clock used for the test and supply to the measuring object 32, an oscillation controller 12 for controlling the frequency of the oscillator 18, and a clock selector 20 for selecting a clock signal and supply to the measuring object 32.

The pattern generation circuit 19 includes a counter 24 for counting a clock number and outputting a count value, a memory 26 for outputting a predetermined test pattern to the measuring object 32 based on the count value the counter 24 outputs, and a data selector 28 for selecting an obtained test pattern and outputting to the measuring object 32. Further, the semiconductor device 52 includes a delay circuit 30 for delaying a test interval signal for a predetermined cycle, an AND gate 31 for outputting the clock signal within a period in which the delayed test interval signal is active, a register 36 for storing the test results, a selector 38 for selecting and outputting the test results stored in the register 36, a ripple counter 34 for dividing clocks delayed by the delay circuit 30, several input buffers 10, 14, and 16, and output buffers 40, 42, and 44.

The oscillation controller 12 outputs a signal to the oscillator 18 instructing the oscillator 18 to oscillate at a predetermined frequency. The oscillator 18 generates clocks, the frequency of which are indicated by the oscillation controller 12, and outputs to the clock selector 20. The oscillator 18 can generate the maximum frequency of clocks under which the semiconductor device 52 can function correctly. An outside signal is input to the clock input buffer 14 from the outside of the semiconductor device 52, and given to the clock selector 20. The clock selector 20 selects an oscillator clock signal generated by the oscillator 18 or an outside clock signal input from the clock input buffer 14, and outputs to a controller 22.

An activation signal for starting the testing of the operation of the measuring object 32 is input to the trigger input buffer 10 from the semiconductor device 52, and given to the controller 22. When the controller 22 receives the activation signal input from the trigger input buffer 10, the controller 22 activates the test interval signal indicating the test interval for a predetermined cycle by synchronizing with clocks output by the clock selector 20.

The counter 24 counts the clock numbers of the clock signal input from the clock selector 20 after a test start signal becomes active, and outputs the count value to the memory 26. Further, the counter 24 outputs a carrier signal to the controller 22 when the count value reaches a predetermined value. The memory 26 outputs a test pattern to the data selector 28 that is determined in advance, in accordance with the count value output from the counter 24. The outside pattern is input to a data input buffer 16 from the outside by the semiconductor device 52, and output to the data selector 28. The data selector 28 selects one of the test patterns output from the memory 26 and an outside test pattern input from the data input buffer 16.

The delay circuit 30 including plural flip-flops connected in series, in which the test interval signal output from the controller 22 is memorized, delays the test interval signal for a predetermined time, and gives the delayed test interval signal to the AND gate 31. The AND gate 31 gives clocks output by the clock selector 20 to the register 36 and the ripple counter 34 during the period in which the delayed test interval signal is active (high). The register 36 including plural flip-flops connected in series, in which the test results input from the measuring object 32 are stored, stores successively the test results output by the measuring object 32 based on the clocks output by the AND gate 31. The selector 38 selects one of the test results stored in each of plural flip-flops included in the data input buffer 16 for output to the outside of the semiconductor device 52 through a register output buffer 42. The ripple counter 34 including plural flip-flops connected in series divides the output signal from the delay circuit 30, divides delayed clocks from the delay circuit 30, and outputs the clocks delayed by the delay circuit 30 to the outside of the semiconductor device 52 through the a clock output buffer 40. The data output buffer 44 directly outputs the test results output by the measuring object 32 to the outside of the semiconductor device 52, from the measuring object 32. The data input buffer 16 and the data selector 28 are used when data is input to the measuring object 32 when the semiconductor device 52 is used in practice. The data output buffer is used when data is output from the measuring object 32 when the semiconductor device 52 is used in practice.

Figure 2:
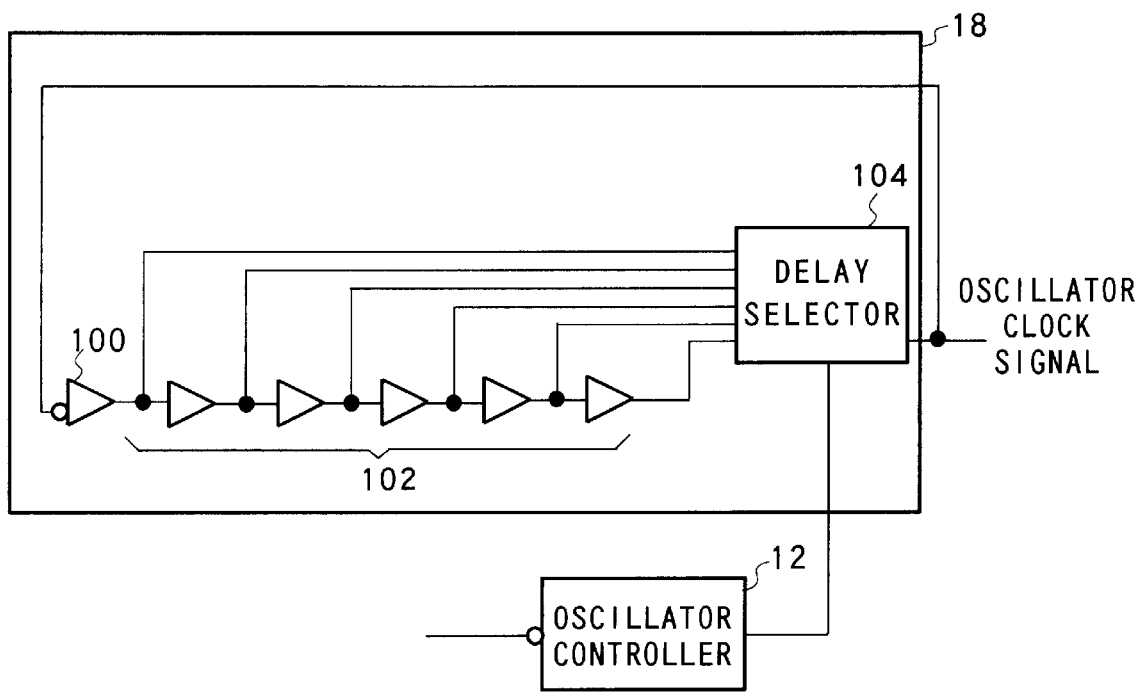
FIG. 2 shows a circuit diagram of the oscillator 18.

FIG. 2 shows a circuit diagram of the oscillator 18. The oscillator 18 includes an inverter 100 through which the input signal is output after being inverted, multiple stage delay devices 102 for delaying the signal output from the inverter 100, and a delay selector 104 for selecting arbitrarily one output from the stage delay devices 102 and inputting to the inverter 100. The signal output from the inverter 100 is delayed because of passing through multiple stage delay devices 102, the output of which is selected by the delay selector 104, and input to the inverter 100 in reverse. Since the signal output from the inverter 100 is reversed each time the inverter 100 is re-input, a pulsating signal is generated. The delay selector 104 defines a pulsating signal that is generated by selecting one output from multiple stage delay devices 102. When an output from the delay device 102 closer to the inverter 100 is selected, a signal output from the inverter 100 passes through less delay devices 102, is input to the inverter 100 again with higher speed, thus the frequency of a generated signal increases.

When an output from the delay device 102 far from the inverter 100 is selected, the signal output from the inverter 100 passes through many delay devices 102, is input to the inverter 100 again at lower speed, thus the frequency of the generated signal is lower. The oscillator controller 12 defines a frequency of an oscillator clock signal generated by the oscillator 18 by outputting a signal to the delay selector 104 to designate which outputs from the delay devices 102 should be selected. The delay selector 104 selects an output from the delay device designated by the oscillation controller 12, and then outputs as an oscillator clock signal.

Figure 3:
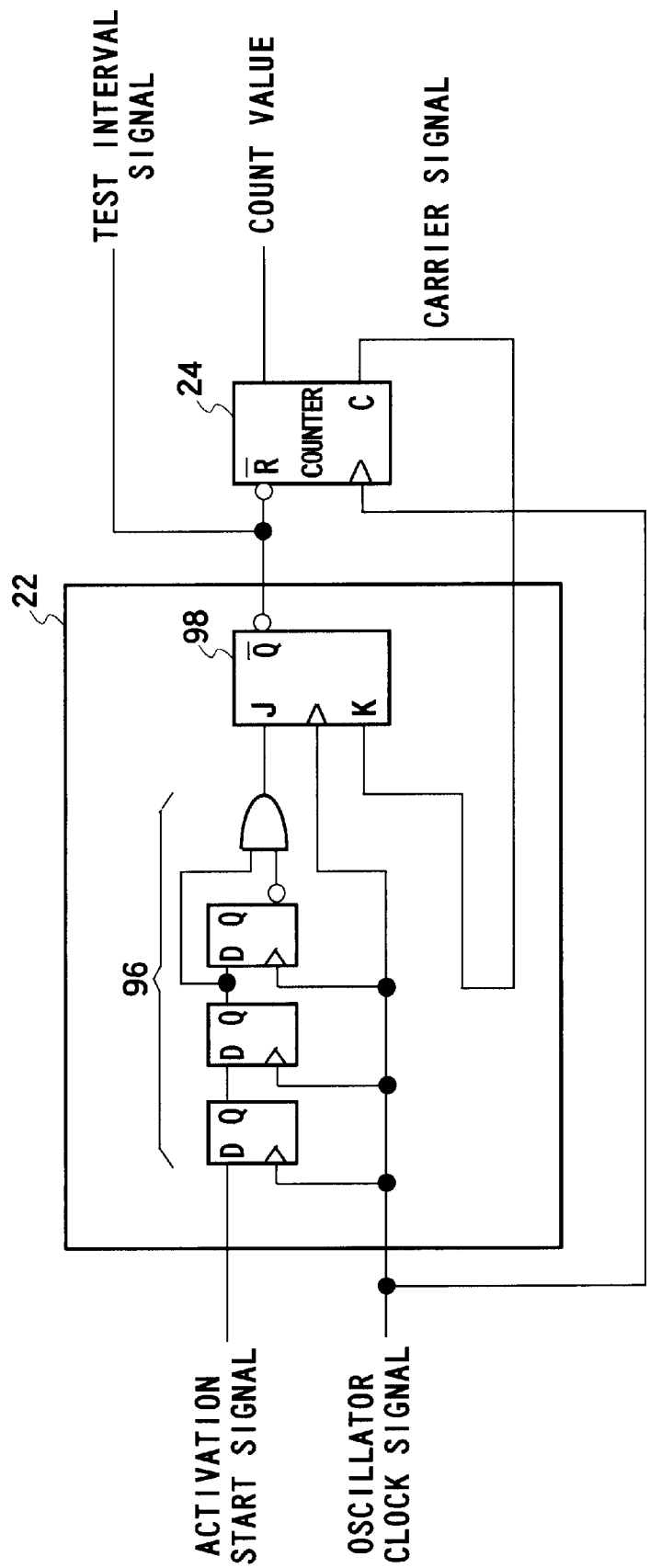
FIG. 3 shows a circuit diagram of the controller 22.

FIG. 3 shows a circuit diagram of the controller 22. The controller 22 includes a delay flip-flop 96 for outputting a test start signal when the activation signal becomes active, and a JK flip-flop 98. The JK flip-flop 98 activates the test interval signal when the delay flip-flop 96 outputs the test start signal and inactivates the test interval signal when the counter 24 outputs a carrier signal. The delay flip-flop 96, JK flip-flop 98, and the counter 24 operate corresponding to an oscillation clock signal. The test start signal is activated when the test start signal becomes active, and inactivated when the counter 24 outputs the carrier signal. Therefore, it is possible to generate a test interval signal with a required cycle by setting the count value at the time when the carrier signal is output to the counter 24.

Figure 4:
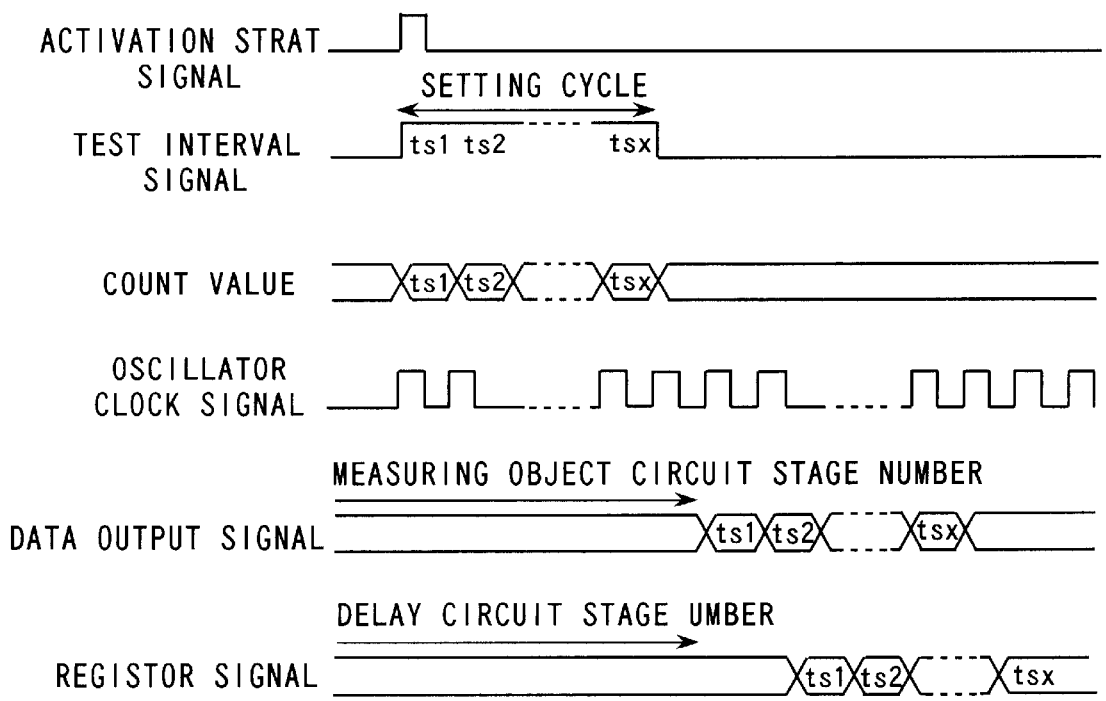
FIG. 4 is a timing chart showing a signal generated by a semiconductor device when the test is performed.

FIG. 4 is a timing chart showing a signal of the semiconductor device 52 when a test is performed. The controller 22 activates the test interval signal when the activation signal becomes active (tsl). If the count value is set to X at the time when the count value of the counter 24 outputs the carrier signal, the counter 24 gives a carrier signal to the controller 22 when the count value reaches X. The test interval signal is set for inactive when the controller 22 has received the carrier signal (tsx). Therefore, a cycle (ts1 to ts2) of the test interval signal is set by setting the count value X. The count value is the clock number of the oscillator clock signal between the state of the test interval signal becoming active (ts1) and the counter value reaching the predetermined value X (tsx). The data output signal is the test results generated by the measuring object 32, and also has cycles, the number (ts1 to tsx) of which is equal to a cycle number set by the test interval signal. The data output signal is time-delayed for the multiple stages of the measuring object 32. The resistor signal is a signal of the test result output from the register output buffer 42, and also has a cycle number equal to the number of the data output signal. Since the register signal is selected and output by the selector 38 after the register signal, (in which the delayed time is nearly equal to the delayed time by the measuring object 32), is time-delayed by the delay circuit 30 and stored in the register 36, output timing is delayed compared to the data output signal.

Figure 5:
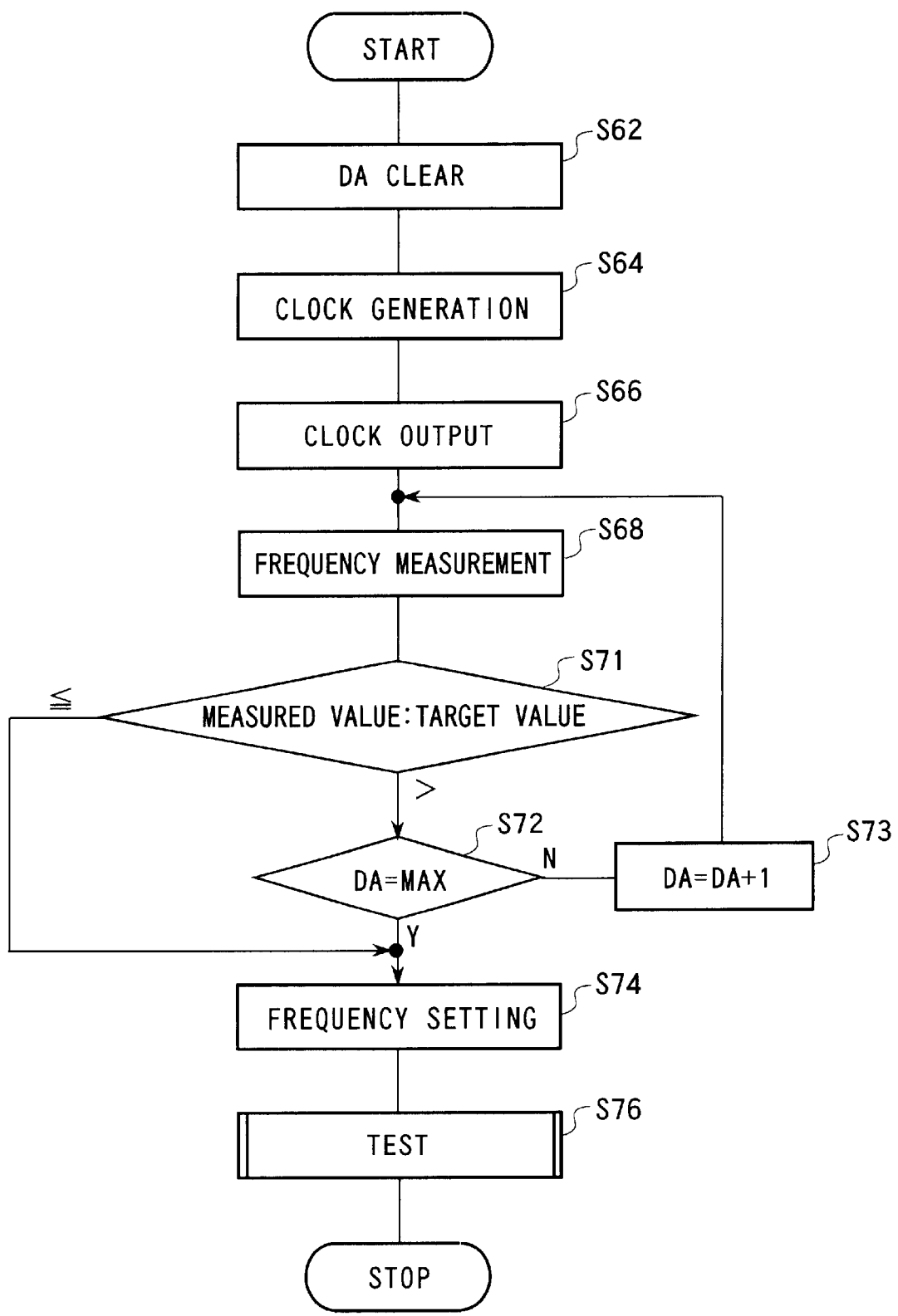
FIG. 5 shows a procedure for testing the operation of the measuring object circuit 32.

FIG. 5 is a flow-chart showing the testing of an operation of the controller 22. Initially, a setting value DA is set (cleared) to a minimum value (S62). In FIG. 2, the oscillator 18 sets the maximum generatable frequency by setting the oscillation controller 12, in order for the delay selector 104 to select the output from the inverter 100. Next, the oscillator 18 generates the oscillator clock signal, the frequency of which corresponds to the setting value DA (S64). The clock selector 20 outputs the oscillator clock signal generated by the oscillator 18 (S66). The oscillator clock signal is divided by ¼ by the ripple counter 34 through the clock selector 20 and the AND gate 31, and output to the outside of the semiconductor device 52 through the clock output buffer 40. The frequency of the oscillator clock signal generated by the oscillator 18 is calculated by measuring the frequency output to the outside and multiplying the measured value by 4, that is, a divided value by the ripple counter 34 (S68).

Next, a comparison between the target frequency value and a measured value that is measured and calculated in step 68 is made (S71). If the measured value is less than the target value, the target value DA is retained (S74). If the measured value is greater than the target value, a judgment is performed of whether or not the current setting value DA is the potential maximum value of the setting value DA (S72). If the setting value DA is the maximum value, the setting value DA is retained (S74). If the setting value DA is not the maximum value, it is possible to lower the frequency of the oscillator clock signal by increasing the setting value DA. Thus, after the setting value DA in which 1 is added to the existing setting value DA is set as a new setting value DA (S73), a return to the frequency measurement step occurs (S68). By repeating steps from the frequency measurement step (S68) to the setting value addition step (S73), it is possible to bring the oscillator clock frequency output from the oscillation controller 12 close to the target value. The frequency used for the test is set by setting the setting value DA determined according to the above-described procedure, in the oscillation controller 12 (S74). Finally, the measuring object 32 is tested using the oscillator clock signal, the frequency of which corresponds to the setting value DA set in the oscillation controller 12. A judgment is then performed of whether or not the measuring object 32 operates correctly by measuring the test result, in other words, to decide if it has passed or failed (S76).

Figure 6:
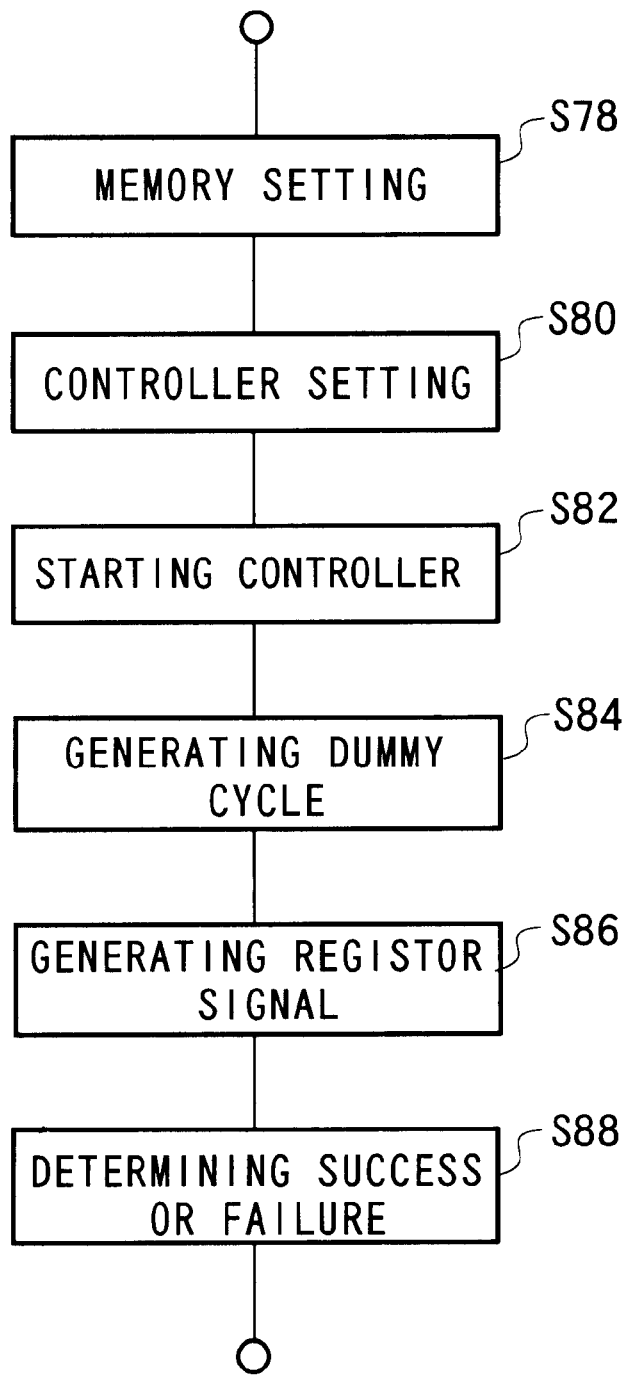
FIG. 6 shows a detailed procedure of the test (S76).

FIG. 6 shows a detailed procedure of the test step (S76) shown in FIG. S. The test pattern for testing the measuring object 32 is stored in the memory 26 in the order generated (S78). If the memory 26 is a mask memory, the test pattern is stored in the memory 26 during fabrication of the semiconductor device 52. The test pattern may be written on the memory 26 from the outside of the semiconductor device 52 after fabricating the semiconductor device 52 when the memory 26 is a rewritable memory such as SRAM. The test pattern is output only whilst the controller 22 keeps the test interval signal active. This test interval signal then returns to inactive when a carrier signal is output from the counter 24. Since a count value is set when the counter 24 outputs the carrier signal, a cycle for the test interval signal output by the controller 22 is set (S80).

Further, the controller 22 outputs the test interval signal (S82) by providing an activation start signal to the trigger input buffer 10. The test interval signal is input to the delay circuit 30, and output from the delay circuit 30 after being delayed by the number of stages of flip-flops of the delay circuit 30. While the test interval signal is delayed, the test pattern is provided to the measuring object 32. The measuring object 32 is tested by supply of the test pattern, and the test result is output from the measuring object 32. At the same time as the measuring object 32 initiates the output of the test results, the output of the test interval signal is also initiated. While the delayed test interval signal is active, the AND gate 31 gives the oscillator clock signal to the register 36. The test interval signal is kept active during the time necessary to shift the first test result to the flip-flop close to the most output side (latter stage) among the flip-flops in the register 36. The test results are stored successively in the flip-flops of the register 36 based on the delayed test interval signal output by the delay circuit 30 (S84). This storing cycle is called a dummy cycle. Next, the selector 38 selects the desired test results from among test results stored in the register 36, and outputs this as a resistor signal (S86). Finally, judgment is performed of whether or not the measuring object 32 operates normally, by comparing the resistor signal measured with an expected value of the resistor signal obtained when a normal semiconductor device is tested (S88).

Accordingly, since the semiconductor device 52 includes the function for testing an inner circuit of the semiconductor device 52, it is possible to test the semiconductor device 52 in advance, for the frequency range used in practice. Therefore, since the semiconductor device 52 can be tested using the actual frequency used in practice, it is possible to remove a semiconductor that will fail in the test with the frequency used in practice, and thus yield rate is improved.

The invention is described based on the preferred embodiment. The scope of the present invention is not limited to the scope of the above-described preferred embodiment. It is clear to a person with ordinary skill in the art that various modifications or improvements can be added to the preferred embodiment. It is also clear from the scope of patent claims that the embodiments added by such modifications or improvements can be included in the scope of the present invention.

As explained above, according to the present invention, it is possible to provide a semiconductor device with an improved yield rate.

What is claimed is:

1. A semiconductor device, comprising:
    a measuring object circuit;
    an oscillator generating a clock signal having a frequency at which said measuring object functions;
    a pattern generation circuit for generating a test pattern used for testing the operation of a measuring object circuit, wherein said pattern generation circuit outputs said test patterns to said measuring object circuit according to a timing of said clock signal; and
    a data output terminal for outputting a test result generated by said measuring object circuit when the test pattern is given to said measuring object circuit.

2. A semiconductor device as claimed in claim 1, wherein said semiconductor device further comprises a register for storing the test result when the test is performed and said data output terminal outputs the test result which is temporarily stored in the register.

3. A semiconductor device as claimed in claim 2, wherein the register includes plural flip-flops connected in series, for storing the test result input from said measuring object circuit.

4. A semiconductor device as claimed in claim 2 further comprising a selector for selecting and outputting one of the test results stored in each of plural registers, wherein said data output terminal outputs the test result selected by said selector to the outside of said semiconductor device.

5. A semiconductor device as claimed in claim 1 further comprising;
    an oscillator for generating and providing a clock with a frequency used for the test to said measuring object circuit; and
    a frequency control means for controlling the frequency oscillated by said oscillator.

6. A semiconductor device as claimed in claim 5, wherein said frequency control means includes an oscillation controller for outputting a signal to said oscillator indicating to said oscillator a required frequency of oscillation.

7. A semiconductor device as claimed in claim 5, wherein said oscillator generates a clock with a maximum frequency under which said semiconductor device can operate normally.

8. A semiconductor device as claimed in claim 5, wherein said oscillator includes:
    an inverter for outputting a reversed input signal;
    a multiple stage delay device for delaying a signal output by said inverter; and
    a delay selector for selecting any output from said delay device and inputting to said inverter.

9. A semiconductor device as claimed in claim 5 further comprising:
    a trigger input terminal for inputting an activation signal for starting the test; and
    a controller for controlling a test interval signal indicating a test interval for an active test period for a predetermined cycle by synchronizing with said oscillator when the activation signal has been received,
    wherein said pattern generation circuit generates the test pattern when the test interval signal is active.

10. A semiconductor device as claimed in claim 9 further comprising:
    a counter for counting a clock number of a signal of the clock input after receiving a test start signal,
    wherein said controller inactivates the test interval signal when a count value of said counter reaches a predetermined value.

11. A semiconductor device as claimed in claim 10, wherein said pattern generation circuit includes a memory for inputting a count value output from said counter and outputting a predetermined test pattern to said measuring object circuit corresponding to the count value.

12. A semiconductor device as claimed in claim 10, wherein said controller includes:
    a delay flip-flop for outputting the activation signal when the activation signal becomes active; and
    a flip-flop for initiating output of said test interval signal when said delay flip-flop outputs said activation signal, and inactivating said test interval signal when the count value of said counter reaches a predetermined value.

13. A semiconductor device as claimed in claim 5 further comprising:
    a delay circuit for delaying the clock for a predetermined time, wherein the register for storing the test result stores the test result based on the clock delayed by said delay circuit.

14. A semiconductor device as claimed in claim 13 further comprising:
    a ripple counter for dividing the clock delayed by said delayed circuit; and
    a clock output terminal for outputting the divided clock.

15. A semiconductor device as claimed in claim 14, wherein said ripple counter includes plural flip-flops connected in series for dividing an output signal output from said delay circuit.

16. A semiconductor device as claimed in claim 13 wherein said delay circuit includes plural flip-flops connected in series for memorizing the test interval signal output from said controller.

17. A semiconductor device as claimed in claim 1 further comprising a clock input terminal for inputting a clock used in the test and supply to said measuring object circuit.

18. A semiconductor device as claimed in claim 17 further comprising a clock selector for selecting one of clocks oscillated by said oscillator for oscillating the clock used for the test and supply to said measuring object circuit.

19. A semiconductor device as claimed in claim 1 further comprising a data input terminal for inputting the test pattern and supply to said measuring object circuit.

20. A semiconductor device as claimed in claim 19, wherein said pattern generation circuit includes a data selector to select one test pattern from the test patterns output by a memory memorizing the test patterns and the test patterns input from the data terminal, for output to said measuring object circuit.

21. A method for testing a semiconductor device in which a measuring object circuit and a pattern generation circuit for generating a test pattern are included, said method comprising:

generating a test pattern used for testing said measuring object circuit in a pattern generation circuit;

generating a clock signal having a frequency at which said measuring object functions;

giving the test pattern generated by the pattern generation circuit to the measuring object circuit according to a timing of said clock signal;

outputting the test result generated by the measuring object circuit to an outside of the semiconductor device by giving the test pattern to the measuring object circuit.

22. A method for testing a semiconductor device as claimed in claim 21, wherein said outputting of said test result includes:

storing the test result in a register installed in the semiconductor device; and outputting the test result stored in the register.

23. A method of testing a semiconductor device as claimed in claim 22, wherein said storing the test result stores said test result output from the measuring object circuit successively in plural flip-flops connected in series in the semiconductor device.

24. A method of testing a semiconductor device as claimed in claim 22, wherein said outputting the test result selects one of the test results stored in each of plural registers for output to an outside of the semiconductor device.

25. A method of testing a semiconductor device as claimed in claim 21 further comprising:

oscillating a clock with a frequency used for the test and supply to the measuring object circuit; and controlling the frequency.

26. A method of testing a semiconductor device as claimed in claim 25, wherein said controlling the frequency include:

generating a clock with a maximum frequency by which the semiconductor device is capable of operating normally;

outputting frequency information indicating the frequency to an outside of the semiconductor device; and decreasing successively the frequency until said frequency information indicates that the frequency has reached a predetermined value.

27. A method of testing a semiconductor device as claimed in claim 25 further comprising:

dividing the clock; and outputting the clock divided by said process of dividing the clock, wherein said controlling the frequency controls the frequency using the clock output from said process of outputting the clock.

28. A method of testing a semiconductor device as claimed in claim 25, wherein said supply of the test pattern includes:

inputting an activation signal for starting the test;

activating the test interval signal indicating that the test is being executed for a predetermined cycle when the activation signal is received; and generating the test pattern when the test interval signal is active.

29. A method of testing a semiconductor device as claimed in claim 28, said activating the test interval signal includes:

counting a clock number of the clock signal input after the test start signal is received; and inactivating the test interval signal when the count value reaches a predetermined value.

30. A method of testing a semiconductor device as claimed in claim 29, wherein said generating the test pattern inputs the count value and determines the test pattern corresponding to the count value in advance, said test pattern which is then output to the measuring object circuit.

31. A method of testing a semiconductor device as claimed in claim 25 further includes:

delaying the clock for a predetermined time, wherein said storing the test result stores the test result based on the clock delayed by the process of delaying the clock.

32. A method of testing a semiconductor device as recited in claim 31, delaying the clock delays the clock by storing temporarily the test interval signal in plural flip-flops connected in series.

* * * * *